United States Patent [19]

Suzuki et al.

[11] Patent Number: 4,629,915
[45] Date of Patent: Dec. 16, 1986

[54] FREQUENCY DISCRIMINATION CIRCUIT

[75] Inventors: Yutaka Suzuki; Yuji Kato, both of Zama, Japan

[73] Assignee: Nissan Motor Company, Limited, Kanagawa, Japan

[21] Appl. No.: 621,715

[22] Filed: Jun. 18, 1984

[30] Foreign Application Priority Data

Jun. 20, 1983 [JP] Japan .................................. 58-110708

[51] Int. Cl.$^4$ ............................................... H03K 9/06
[52] U.S. Cl. .................................... 307/522; 307/273; 307/265
[58] Field of Search ....................... 307/273, 271, 522; 328/110, 111, 112, 141, 207

[56] References Cited

U.S. PATENT DOCUMENTS

| | | | |
|---|---|---|---|
| 3,668,423 | 6/1972 | Couch .................................. | 307/273 |
| 3,753,130 | 8/1973 | Pezzuti .................................. | 307/273 |
| 3,753,135 | 8/1973 | Kastner et al. ....................... | 328/111 |
| 4,339,723 | 7/1982 | Yee ....................................... | 328/112 |

OTHER PUBLICATIONS

R. Schneider, "Single One-Shot Senses Frequency Limits", EDN, Electrical Design News, No. 16, Sep., 1981, p. 208.
Patent Abstracts of Japan, vol. 7, No. 57, 1983 (JP-A-5-7-203962).

*Primary Examiner*—John S. Heyman
*Assistant Examiner*—Trong Quang Phan
*Attorney, Agent, or Firm*—Schwartz, Jeffery, Schwaab, Mack, Blumenthal & Evans

[57] ABSTRACT

The frequency discrimination circuit includes a monostable circuit into which an input signal is fed and a D-type flip-flop connected to the output side of the monostable circuit for generating a frequency discriminated signal. The circuit further includes a time constant modifying circuit for modifying a time constant of the monostable circuit according to the frequency discriminated signal from the D-type flip-flop.

7 Claims, 7 Drawing Figures

FIG. 1
PRIOR ART
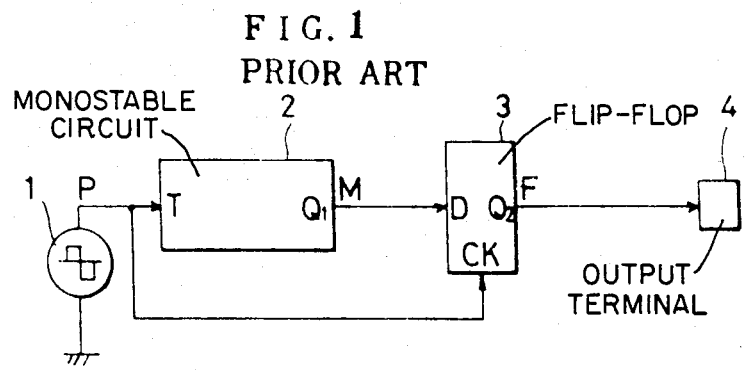
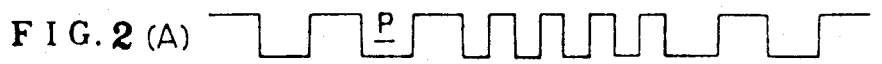
FIG. 2(A)
FIG. 2(B)
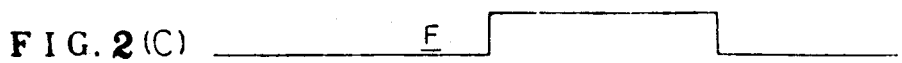
FIG. 2(C)

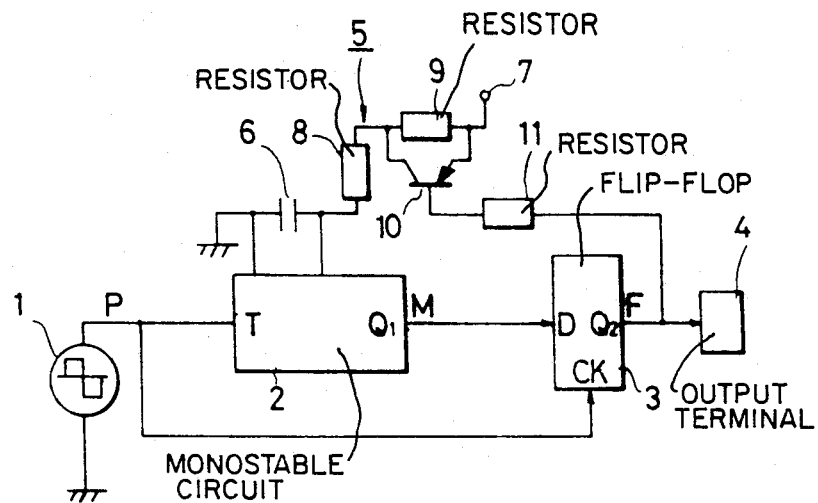
FIG. 3
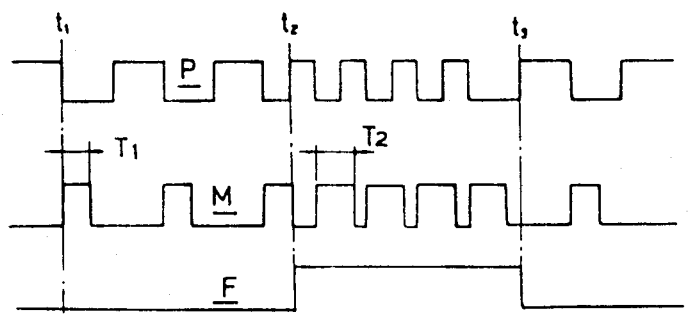
FIG. 4 (A)
FIG. 4 (B)
FIG. 4 (C)

FREQUENCY DISCRIMINATION CIRCUIT

BACKGROUND OF THE INVENTION

1. Field of the Invention

The present invention relates to a frequency discrimination circuit which includes a monostable circuit into which an input frequency signal is fed, and a D flip-flop which is connected to the output side of the monostable circuit, for maintaining an output signal, which discriminates the high and low levels of the frequency signal which is fed into the monostable circuit, from the D flip-flop.

2. Description of the Prior Art

A conventional frequency discrimination circuit, is illustrated in FIG. 1 (for example, as shown on page 633 of the "Hitachi KTL Data Book," published in March 1983). This circuit comprises an input signal source 1, a monostable circuit 2 into which a frequency pulse signal is fed from the input signal source 1, a D flip-flop 3 which receives, at the same time, the output signal of the monostable circuit 2 into its input terminal D and the frequency signal from the input signal source 1 into its clock input terminal CK, and an output terminal 4 which receives a frequency discriminated signal from a positive output terminal Q2 of the D flip-flop 3.

The pulse signal P, whose frequency fluctuates as shown in FIG. 2 (A), is outputed from the input signal source 1. When the D flip-flop 3 is put into reset status, the monostable circuit 2, as shown in FIG. 2 (B), is triggered at the trailing edge of the pulse signal P, and outputs the signal M, which intermittently reaches its high level for a prescribed time To, according to the prescribed time constant.

A D flip-flop 3 outputs the frequency discriminated signal F from its positive output terminal Q according to the pulse signal P from the input signal source 1 and the output signal M of the monostable circuit 2, and at the point where the ouptut signal M of the monostable circuit 2 is at the high level, and where the pulse signal P of the input signal source 1 becomes the high level, as shown in FIG. 2 (C). Then, at the point where the output signal M reaches its low level and the pulse signal P reaches its high level, the frequency discriminated signal returns to its low level. Accordingly, because the frequency discriminated signal F from the D flip-flop 3 reaches the high level at the time when the frequency of the pulse signal PO from the input signal source 1 reaches a high frequency exceeding the prescribed frequency, it is possible to discriminate the high and low levels of the input frequency signal according to the frequency discriminated signal F.

However, in this type of conventional frequency discrimination circuit, the time constant of the monostable circuit 2 is constant, so for this reason, at the time when the pulse width of that output signal P rises to the neighborhood of the set frequency, the frequency discriminated signal F of the D flip-flop produces troublesome hunting.

SUMMARY OF THE INVENTION

The object of the present invention is to provide a frequency discrimination circuit which is capable of obtaining a reliable frequency discriminated signal.

The other object of the present invention is to provide a frequency discrimination circuit which is capable of preventing hunting in the neighborhood of the set frequency.

The further object of the present invention is to provide a frequency discrimination circuit which is capable of eliminating the problems found in the prior art frequency discrimination circuit.

Briefly described, these and other objects of the present invention are accomplished by provision of an improved frequency discrimination circuit which includes a monostable circuit into which is fed an input frequency signal, a D flip-flop connected to the output side of the monostable circuit, and a time constant modifying circuit for modifying a time constant of the monostable circuit in accordance with the frequency discriminated signal from the D flip-flop.

BRIEF DESCRIPTION OF THE DRAWINGS

The present invention will be better understood from the detailed description given below, and the accompanying drawings which are given by way of illustration only, and thus are not limitative of the present invention and wherein:

FIG. 1 is a block diagram illustrating a prior art frequency discrimination circuit;

FIG. 2 is a signal wave form diagram in way of explanation of the operation of the circuit in FIG. 1;

FIG. 3 is a block diagram illustrating one embodiment of a frequency discrimination circuit according to the present invention;

FIG. 4 is a signal wave form diagram in way of explanation of the operation of the circuit in FIG. 3;

DETAILED DESCRIPTION OF THE INVENTION

Figure 5:
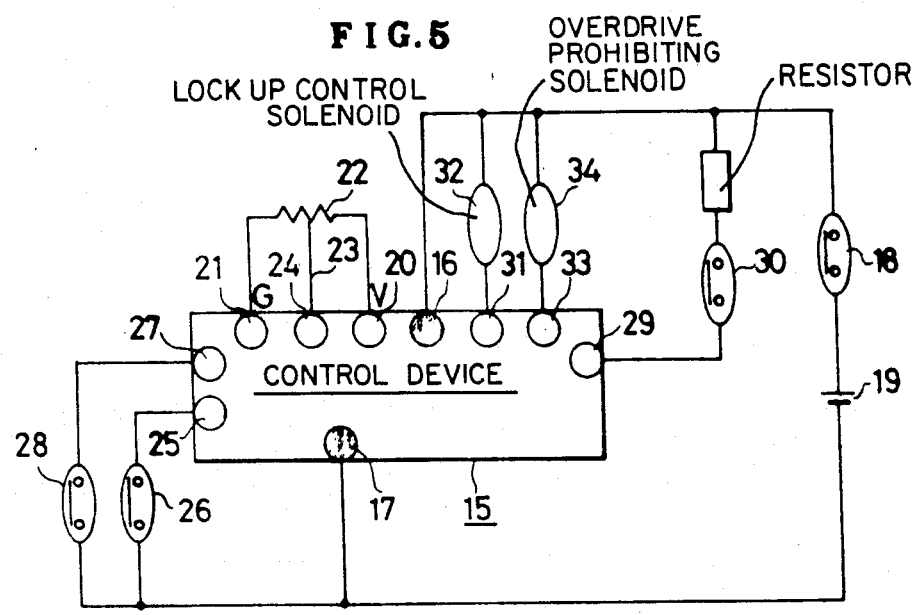
FIG. 5 is a diagram of a control circuit illustrating another embodiment of the present invention applied to an automatic transmission in a vehicle.

Referring to FIG. 3, there is shown a block diagram illustrating one embodiment of the present invention.

A monostable circuit 2 to which is supplied an input frequency signal P from an input signal source 1, is connected to a time constant modifying circuit 5, which in turn comprises a condenser 6, resistances 8 and 9 which are connected in series between the condenser 6 and a direct current power source terminal 7, and a PNP-type transistor 10 which is used as a by-pass is connected in parallel with the resistance 9. A frequency discriminated signal F which is output from a D flip-flop 3 to an output terminal 4, is supplied as required to the base of the transistor 10 through a resistance 11.

The operation of this circuit is as follows. At a time t1, the input frequency signal P from the input signal source 1 is at a low frequency, as shown in FIG. 4 (A), and the frequency discriminated signal F from the D flip-flop 3 is maintained at the low level as shown in FIG. 4 (C), and in this status, due to the frequency discriminated signal F being at the low level, the PNP transistor 10 is maintained in the ON status. For this reason, the signal by-passes the resistance 9 of the time constant circuit 5 through the transistor 10. As a result, the prescribed time constant determined by the condenser 6 and the resistance 8 is small, and accordingly a time interval T1, during which an output signal M triggered at the trailing edge of the input frequency signal P from the monostable circuit 2 maintains a high level, is comparatively short as illustrated in FIG. 4 (B).

In addition, the frequency of the input frequency signal P is at the high level, and at time t2, the output signal M of the monostable circuit 2 is at a high level, and when the input frequency signal P reaches the high level, the frequency discrimination circuit F of the D flip-flop 3 also reaches the high level as shown in FIG. 4 (C). When the frequency discriminated signal F reaches the high level in this way, the PNP transistor 10 of the time constant modifying circuit changes to the OFF status, and for this reason, the time constant of the monostable circuit 2 receives a comparatively high modification by the condenser 6 with the resistances 8 and 9. Accordingly, after time t2, the output signal M which triggered at each of the trailing edges of the input signal 2 of the monostable circuit 2, as shown at T2 (T2>T1) in FIG. 4 (C), is maintained at the high level for a long period.

In addition, the frequency of the input frequency signal P becomes low, and with the output signal M of the monostable circuit 2 at the low level status, the input frequency signal P rises to the high level at time t3, the frequency discriminated signal F of D flip-flop 3 reverts to the low level, and for this reason, the transistor 10 of the damping factor modifying circuit 5 is turned ON, and the output signal M of the monostable circuit 2 is again maintained at high level for a time interval T1. As a result, the time at which the frequency discrimination signal F of the D flip-flop 3 reaches to the high level, that is to say, after or at the time at when the frequency of the input frequency signal P achieves a predetermined set value, the time constant of the monostable circuit 2 is modified to a large value, and the length of time that this output signal M is maintained at the high level becomes long. As a result, when the frequency of the input frequency signal P approaches close to the set frequency, hunting is not produced and it is possible to obtain a reliable frequency discriminated signal F. In addition, as a result of the modification of the time constant of the monostable circuit 2, the time intervals T1 and T2 at high level have the relationship T2>T1. So, a difference in responsiveness is produced for the intervals between the time when the frequency of the input frequency signal P exceeds the set frequency, and the time when, from this status, it is less than the set frequency, resulting in hysteresis.

Furthermore, for this embodiment of the present invention, an explanation has been given of the application of the PNP transistor 10 in the time constant circuit, but if an NPN transistor were substituted for the PNP transistor, and the signal were provided to that base from a negative output terminal Q, and the inverted signal F of the frequency discriminated signal F were supplied, operation could be carried out in the same way as in the above example. In addition, if the resistances 8 and 9 were connected in parallel, and if the transistor were connected in series with any other resistances, this would still be acceptable, the main point being that any configuration by which the time constant is modified by means of a frequency discriminated signal is satisfactory.

Figure 6:
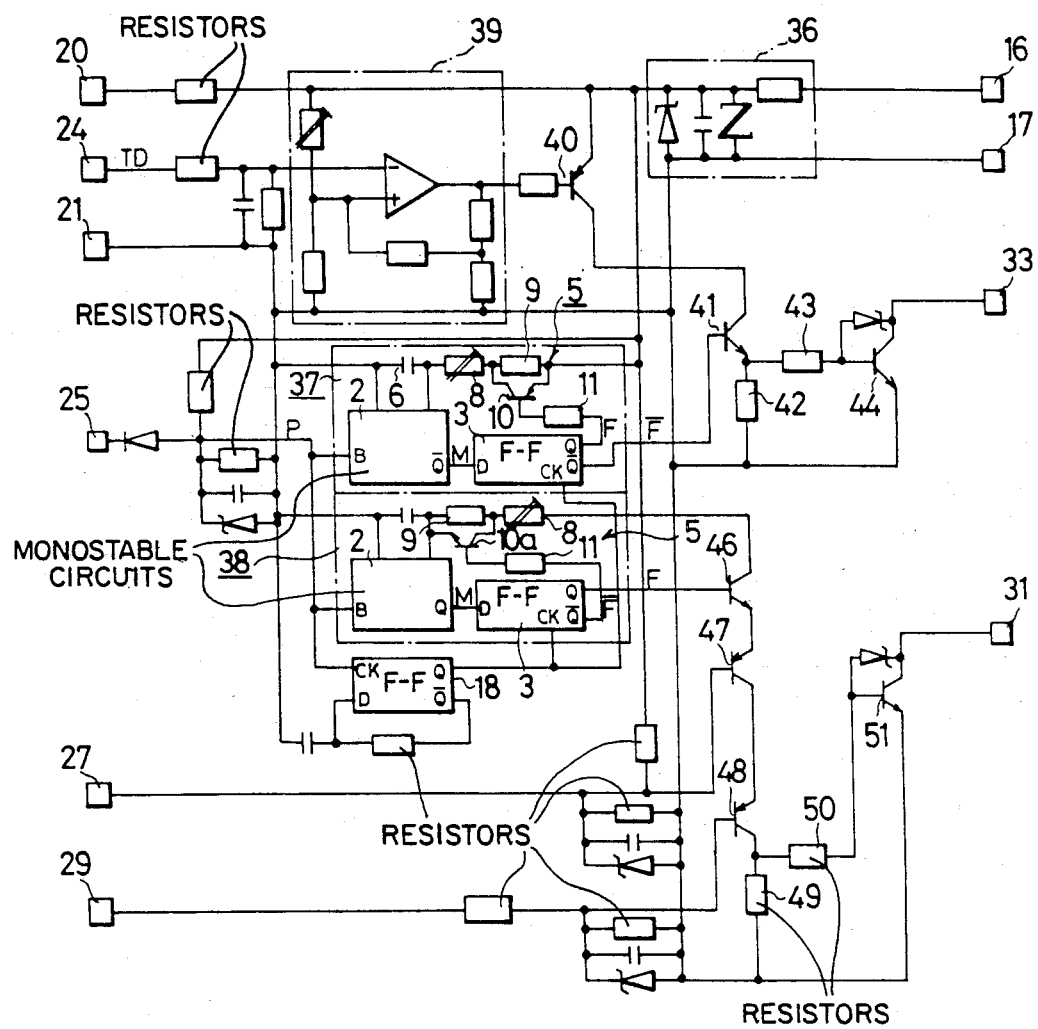
FIG. 6 is a circuit diagram illustrating a concrete example of the control device in FIG. 5.

Next, another embodiment of the present invention, in which an application of the frequency discrimination circuit is made to an automatic transmission for an automobile, as illustrated in FIG. 5 and FIG. 6, is explained.

In this embodiment of the present invention an explanation is given for the cases where lock-up control for an automatic transmission, and overdrive control are carried out.

As shown in FIG. 5, a control device 15 for an automatic transmission is connected from a power input terminal 16 and a grounding terminal 17 to a battery 19 through an ignition switch 18. In addition, a potentiometer 22, which acts as a throttle-opening detection apparatus is connected between a power output terminal 20 and a grounding terminal 21. A movable contact element 23, corresponding to the opening and closing of the throttle is connected to a throttle-movement signal input terminal 24. In addition, a vehicle speed detection device 26, with ON-OFF action corresponding to the vehicle speed, is connected between a vehicle speed detection signal input terminal 25 and the negative terminal side of the battery 19. In addition, an overdrive switch 28 is connected between an overdrive signal input terminal 27 and the negative side of the battery 19, while an idling switch 30 is connected between an idling signal input terminal 29 and the ignition switch 18. Furthermore, a lock-up control solenoid 32 is connected between a lock-up control terminal 31 and the ignition switch 18, while an overdrive prohibiting solenoid 34 is connected between an overdrive control terminal 33 and the ignition switch 18.

The above are the external connection circuits for the control device 15, while the internal circuits for the control device 15 are shown in FIG. 6.

A constant voltage circuit 36 is connected to the power input terminal 16 from its input side, and to the grounding terminal 17.

Some frequency discrimination circuits 37 and 38, in the same way as in the previously described embodiment of the present invention, are each made up of a monostable circuit 2, which has a time constant circuit 5, and a D flip-flop 3. The input side of each of the monostable circuits 2, is connected to the connection points of the vehicle speed signal input terminal 25 and the constant voltage circuit 36, and the ON-OFF signal of the vehicle speed detection device 26 receives the inverted input frequency signal P. Furthermore, the input frequency signal P is divided into clock signals by means of a frequency dividing circuit 18 made up of D flip-flops, and these clock signals are input to the clock input terminals CK of the D flip-flop 3 of each of the frequency discrimination circuits 37 and 38. Also, an NPN transistor 10a, which is substituted for the PNP transistor 10, is hooked into the time constant circuit of the frequency discrimination circuit 38, and an inverted signal F, from the frequency discriminated signal F, is obtained from the negative output terminal Q of the D flip-flop 3, and supplied to the base of the transistor 10a. In this case, the set frequencies of the frequency discrimination circuits 37 and 38 are set so that the set frequency of the frequency discrimination circuit 37 is higher than that of the frequency discrimination circuit 38, through use of the semi-fixed resistances 8 in the time constant circuits of the frequency discrimination circuits.

In addition, a throttle-opening detection signal TD which is applied to the throttle-opening detection input terminal 24, is supplied to the base of a PNP transistor 40 through a level discrimination circuit 39. In this case, the level discrimination circuit 39 outputs a low level signal when the throttle-opening detection signal TD is at high level, and outputs a high level when the throttle-opening detection signal TD is at low level. The emitter of the transistor 40 is connected to the positive side of the constant voltage circuit 36, and the collector is connected to the collector of an NPN transistor 41. The base of the transistor 41 is connected to the negative output terminal Q of the d flip-flop 3 of the previously mentioned frequency discrimination circuit 37, and the emitter of the transistor 41 is connected through a resistances 42 to the negative terminal of the constant voltage circiut 36, while at the same time it is connected through a resistance 43 to the base of an NPN transistor 44. The NPN transistor 44 is used to control the previously mentioned overdrive prohibiting solenoid 34, and its collector is connected to the overdrive shift control terminal 33, while its emitter is connected to the neative side of the constant voltage circuit 36 through the resistance 42.

Furthermore, the positive output terminal Q of the D flip-flop 3 of the frequency discrimination circuit 38 is connected to the base of an NPN transistor 46 is connected to the positive side of the constant voltage circuit 36, while the emitter is connected to the emitter of a PNP transistor 47. The base of the transistor 47 is connected to both the positive side of the constant voltage circuit 36 and to the overdrive signal input terminal 27, while the collector is connected to the emitter of a PNP transistor 48, and is activated when the overdrive switch is OFF. The base of the transistor 48 is connected to the idling input signal terminal 29, while the collector is connected to the negative side of the constant voltage circuit 36 through a resistance 49, while at the same time the collector is connected to the base of an NPN transistor 51 through a resistance 50, and is activated when the idling switch 30 is OFF. The transistor 51 is used to drive the lock-up control solenoid 32, and its collector is connected to the lock-up control terminal 31, while its emitter is connected to the negative side of the constant voltage circuit 36.

Next, the use of this device is explained. First an explanation will be given for the case where overdrive shift prohibiting control is being carried out. When the throttle opening becomes large, the throttle-opening detection signal input terminal 24, becomes large, and for this reason the output of the level discrimination circuit 29 switches to low level, and the transistor 40 is activated. Under these conditions, when the vehicle speed is below the prescribed speed, as previously outlined, the low level frequency discriminated signal F from the positive output terminal Q of the frequency discrimination circuit 37 is obtained, and for this reason, the high level frequency discriminated signal F from the negative output terminal Q is obtained. The frequency discriminated signal F is supplied to the transistor 41, activating the transistor 41, and corresponding with this, the transistor 44 is also activated. Accordingly, electric current from the battery is supplied to the overdrive shift prohibiting solenoid 34, thus exciting the solenoid 34, so that the overdrive is prohibited from the up shift operation. In this status, the throttle opening becomes small, and corresponding with this action, the transistor 40 (or 41) becomes inactivated, therefore the transistor 44 also becomes inactivated, and power to the solenoid 34 is halted, and the up-shift action again becomes possible at the overdrive.

Next, an explanation will be given of the lock-up control. When the overdrive switch 28 and the idling switch 30 are in the OFF status, the transistors 47 and 48 enter the ON status, and when the vehicle is running at a higher speed than the prescribed speed, then the high level frequency discriminated signal F is obtained from the positive output terminal Q of the D flip-flop 3 of the frequency discrimination circuit 38, and this signal is supplied to the transistor 46, so that the transistor 46 is activated. As a result of the current flowing through transistors 46, 47, and 48, the transistor 51 is also activated, so that power is supplied to the lock-up control solenoid 32, causing it to be excited, so that lock-up control is carried out. As a result of this status, the vehicle speed is decreased, and either one or the other of the overdrive switch 28 or the idling switch 30 will come ON, so that the transistors 46, 47, and 48 become inactivated, the transistor 51 becomes inactivated, and the lock-up control solenoid 32 reverts to inactive status.

Figure 7:
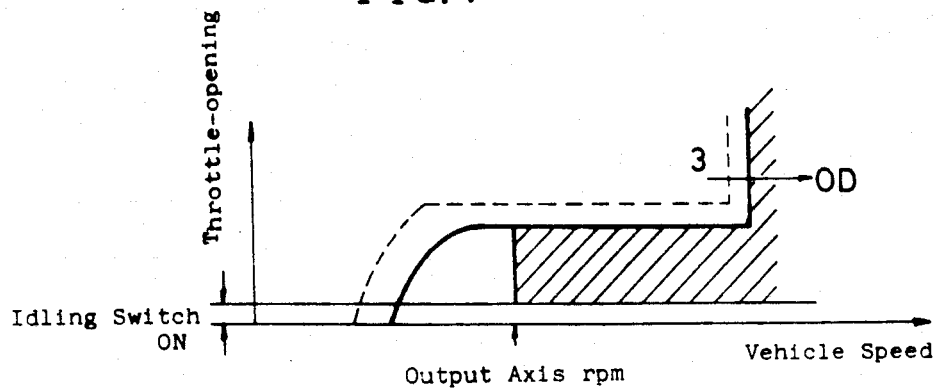
FIG. 7 is a diagram illustrating the transmission lines of the automatic transmission in FIG. 5.

As outlined above, in this embodiment of the present invention, hysteresis is obtained in the time constant modifying circuit 5 with respect to the vehicle speed detection signal for overdrive control and lock-up control, so that control is carried out by means of the frequency discrimination circuits 37 and 38, so that no hunting is produced. For this reason, for the case where snap action for shock prevention is implemented in a control valve for a mechanical automatic transmission utilized with normal governor pressure, as shown in FIG. 7, transmission operation by electronic circuit can be equally carried out, and furthermore, hunting can be relizbly prevented when control of overdrive shift and lock-up control is being carried out by means of speed-detection signal.

As explained above, in the present invention, by modifying the time constant of a monostable circuit by means of a frequency discriminated signal from a D flip-flop, it is possible to obtain a reliable frequency discriminated signal which will prevent hunting in the neighborhood of the set frequency.

Furthermore, the invention being thus described, it will be obvious that the same may be varied in many ways. Such variations are not to be regarded as a departure from the spirit and scope of the invention, and all such modificatons are intended to be included within the scope of the following claims.

What is claimed is:

1. A frequency discrimination circuit comprising:
    a monostable circuit having an input into which a pulsed input signal is fed and having an output, said monostable circuit producing output pulses in response to pulses of said input signal, said monostable circuit having a variable time constant and each said output pulse having a pulse width determined by said time constant;
    a D-type flip-flop having a data input connected to the output of the monostable circuit and having a clock input connected to receive said pulsed input signal so that said D-type flip-flop produces a first output signal when the pulse width of said output pulses is greater than that of said pulsed input signal and a second output when said pulse width of said output pulses is less than that of said pulsed input signal; and
    means for modifying said time constant of the monostable circuit in response to said flip-flop output signals.

2. A frequency discrimination circuit as claimed in claim 1, in which said time constant modifying means modifies the time constant of the monostable circuit at a time when the frequency of the input signal rises to a predetermined value.

3. A frequency discrimination circuit as claimed in claim 1, in which the time constant of the monostable circuit is modified to a large value after the frequency of the input signal achieves a predetermined set value.

4. A frequency discrimination circuit as claimed in claim 1, in which said time constant modifying means comprises a time constant modifying circuit connected to the monostable circuit and the output side of the D-type flip-flop.

5. A frequency discrimination circuit as claimed in claim 4, in which said time constant modifying circuit comprises a condenser, two resistors, and a transistor.

6. A frequency discrimination circuit as claimed in claim 5, in which the condenser is connected in parallel to the monostable circuit, the resistors being connected in series between the condenser and a direct current power source terminal, the transistor being connected in parallel with one of the and having a base connected to the output of the D flip-flop.

7. An apparatus comprising:

an input terminal for receiving a pulsed input signal having a frequency;

means connected to said input terminal for producing a pulsed reference signal having a variable pulse width;

means connected to said reference pulse producing means for comparing the period of said pulsed input signal with pulses of said pulsed reference signal and producing a first output signal when the period of said pulsed input signal satisfies a first condition relative to the pulse width of said pulsed reference signal and a second output signal when the period of said pulsed input signal satisfies a second condition relative to the pulse width of said pulsed output signal; and means connected between said comparing means and said reference pulse producing means for increasing and decreasing the width of said pulses of said pulsed reference signal in response, respectively, to said output signal of said comparing means.

* * * * *